United States Patent [19]

Schulz et al.

[11] Patent Number: 4,472,760
[45] Date of Patent: Sep. 18, 1984

[54] CAPACITOR

[75] Inventors: Egon Schulz, Emmendingen; Erich Schindler, Waldkirch, both of Fed. Rep. of Germany

[73] Assignee: ITT Industries, Inc., New York, N.Y.

[21] Appl. No.: 536,284

[22] Filed: Sep. 27, 1983

[30] Foreign Application Priority Data

Oct. 9, 1982 [EP] European Pat. Off. ........ 82710048.8

[51] Int. Cl.³ .................. H01G 4/10; H02G 13/08
[52] U.S. Cl. .................................. 361/321; 174/52 S
[58] Field of Search ............... 361/306, 307, 321, 322; 174/52 S; 427/125

[56] References Cited

U.S. PATENT DOCUMENTS

| | | | |
|---|---|---|---|
| 2,841,508 | 7/1958 | Roup et al. | 361/322 X |
| 2,891,362 | 6/1959 | Bettridge | 174/52 S X |
| 3,458,783 | 7/1969 | Rosenberg | 361/321 X |
| 3,633,079 | 1/1972 | Watson | 361/321 |
| 4,432,035 | 2/1984 | Hsieh et al. | 361/322 |

FOREIGN PATENT DOCUMENTS

| | | | |
|---|---|---|---|
| 0072500 | 6/1977 | Japan | 361/322 |
| 1170991 | 11/1969 | United Kingdom | 361/322 |

*Primary Examiner*—Donald A. Griffin
*Attorney, Agent, or Firm*—Donald J. Lenkszus

[57] ABSTRACT

A capacitor comprises a capacitor element which is accommodated in a cylindrical casing with electrodes attached to the two end faces thereof. The capacitor element includes a high as possible doped monocrystalline silicon disk, a layer of insulating material arranged on the first main surface thereof, and of a rectangular, first contact electrode at least partly covering the insulating layer. On the second main surface of the capacitor element there is arranged a layer-shaped second contact electrode. The cylindrical casing consists of a glass envelope or tube whose inner diameter is adapted to the diameter of the silicon disk, as well as metal inserts inserted at each end of the casing, contacting the capacitor element and serving as the electrodes.

20 Claims, 4 Drawing Figures

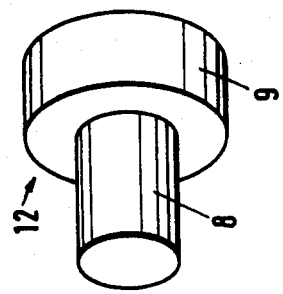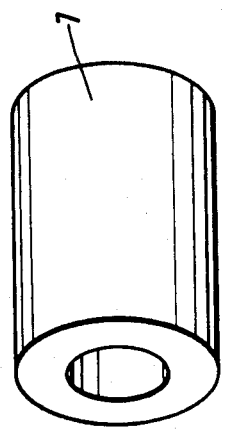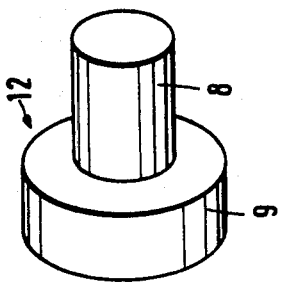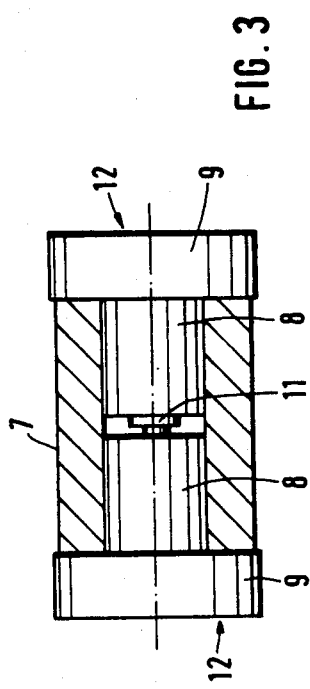

CAPACITOR

BACKGROUND OF THE INVENTION

The invention pertains to a capacitor consisting of a capacitor element which is accommodated in a cylindrical casing provided with electrodes attached to the two end faces thereof, as well as to a process for manufacturing such a capacitor.

The usual types of capacitors which are used in the manufacture of printed circuits, are provided with electrode leads in the form of wires with the aid of which they are soldered to specified points. Automtic insertion machines are available for such capacitors. However, constructional simplification of such machines is limited by the hitherto conventional shape of the capacitors.

SUMMARY OF THE INVENTION

The invention solves the problem of providing a capacitor without wire-shaped leads, which is in particular suitable for being used in automatic component-insertion machines and printed circuits or in radio or television tuners.

A capacitor in accordance with the invention, comprises a capacitor element which is accommodated in a cylindrical casing with electrodes attached to the two end faces thereof. The capacitor element includes a high as possible doped monocrystalline silicon disk, a layer of insulating material arranged on the first main surface thereof, and of a rectangular, first contact electrode at least partly covering the insulating layer. On the second main surface of the capacitor element there is arranged a layer-shaped second contact electrode. The cylindrical casing consists of a glass envelope or tube whose inner diameter is adpated to the diameter of the silicon disk, as well as metal inserts inserted at each end of the casing, contacting the capacitor element and serving as the electrodes. Each of the metal inserts includes a disk portion completely resting on the respective end face of the glass envelope, as well as of an extension portion fitting into the interior of the glass envelope. The sum of both the thickness of the capacitor element and the respective length of the extensions are equal to the length of the glass envelope.

BRIEF DESCRIPTION OF THE DRAWINGS

The invention will now be explained in greater detail with reference to FIGS. 1 to 3 of the accompanying drawings, in which:

FIG. 3 illustrates in partial sectional view the construction of the capacitor according to the invention; and FIG. 4 illustrates the capacitor of FIG. 3 in a partially exploded view.

DETAILED DESCRIPTION

Figure 1:
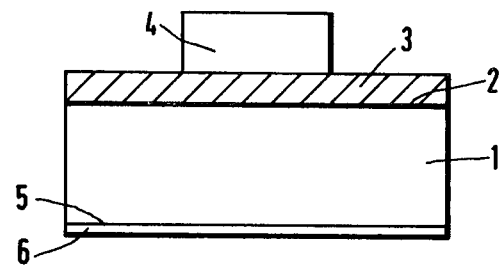
FIG. 1 schematically shows in longitudinal section, a capacitor element according to the invention.

The capacitor element 11 as schematically shown in FIG. 1, consists of a monocrystalline silicon disk 1 doped as highly as possible. On the first main surface 2 there is arranged the insulating layer 3 and, thereon, the preferably rectangular, first contact electrode 4 at least partly covering this surface. The second main surface 5 is coated with the layer-shaped second contact electrode 6.

Figure 2:
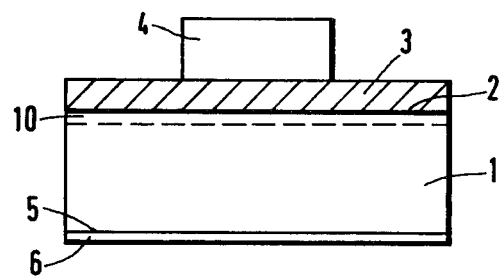
FIG. 2 schematically shows a further embodiment of the capacitor element according to FIG. 1.

FIG. 2 shows a further embodiment of the capacitor element as shown in FIG. 1, with the parts indicated by the reference numerals 1 through 6 correspoding to those of FIG. 1. By the reference numeral 10 there is indicated a layer of the same conductivity type as the silicon disk 1, but doped stil higher, which is arranged on the surface of the first main surface 2 thereof.

FIGS. 3 and 4 show the individual parts of the cylindrical casing as well as a section taken through the construction of the finished capacitor. The cylindrical casing consists of the glass envelope 7 whose inner diameter is adapted to the diameter of the silicon disk 1. The casing includes two metal inserts 12 serving as electrodes. Each insert 12 includes a disk portion 9 which seats on the respective end face of the glass envelope 7. Each insert 12 also includes an extension or plug portion 8 which just fits into the interior of the envelope 7. The sum of the thickness of the capacitor element 11 and the respective lengths of the extension portions 8 is so dimensioned as to correspond to the length of the glass envelope 7.

To manufacture the capacitor element 11 of FIG. 1, a monocrystalline silicon body 1 which is doped as high as possible and of any optional type of conductivity is used. On the first main surface 2 an insulating layer 3, preferably of silicon dioxide or silicon nitride, is deposited in accordance with one of the conventional processes. Next, a plastic film serving as a masking layer is deposited onto the layer of insulating material 3 and in accordance with one of the conventional photolithographic processes, there is produced an opening, e.g., rectangular in the plastic film. In the opening, a first contact electrode 4 consisting of a ductile metal, preferably and substantially of silver, is permitted to grow galvanically. The surface of the opening is chosen in accordance with desired capacity of the capacitor by taking into consideration the thickness of the layer of insulating material. The thicknesses of the first contact electrode 4 and of the silicon disk 1 are preferably dimensioned in such a way as to be in the same order, with the thickness of the contact electrode appropriately amounting to 20 to 30% of the thickness of the silicon disk.

A plurality of capacitive elements may be formed in one silicon plate by using the aforedescribed process. Subsequent to the formation of the elements in a single plates, the plate may be divided utilizing conventional techniques to produce a plurality of capacitor elements.

The finished capacitor element 11 whose longitudinal section is shown in FIG. 1, is then inserted into the glass envelope 7 of FIGS. 3 and 4. Glass envelope 7 is then closed with the already described metal inserts 12 and the whole structure is subjected to a fusing process at a temperature of about 700° C., during which the end faces of the glass envelope 7 are fused to the disks 9. After cooling down, the extensions 8 are in a pressure-contact connection with the capacitor element 11.

The manufacturing process for the capacitor element as shown in FIG. 2, differs from the just described process merely by one additional step, namely by the doping of the first main surface 2 of the monocrystalline silicon disk 1 with a doping agent (dopant) of the same conductivity type with which the disk 1 is doped. Such an additional doping is required in cases where commercially available types of silicon disks have an insufficiently low specific resistance.

For the glass envelope (glass tube), it is preferably suitable to use a conventional glass envelope customarily used for manufacturing semiconductor diodes having a DO-35 standard casing. Capacitors manufactured according to the invention, permit capacities to be obtained ranging from 1.5 to about 200 pF, and are of a quality such that they may be used in radio and television tuners. This is due to the low specific resistance of the silicon disk 1 which lies at about 2 to 4 mΩcm, and which is about 200 μm thick. The thickness of the layer of insulating material with respect to the aforementioned capacities, ranges approximately between 0.2 and 0.8 μm.

What is claimed is:

1. A capacitor comprising:
   a cylindrical casing;
   a capacitor element disposed within said casing, said capacitor element comprising a highly doped monocrystalline silicon disk, a layer of insulating material on a first main surface of said element, a first contact electrode at least partly covering the surface of said insulating layer, and a layer shaped second contact electrode on the second main surface of said element;
   said cylindrical casing comprising a glass envelope having an inner diameter matching the diameter of said cylindrical disk and first and second metal inserts, one at each end of said envelope and each comprising a disk portion covering the respective end face of said glass envelope and a portion extending into said glass envelope, said first and second metal inserts serving as electrode connections to said capacitor element, the sum of the thickness of said capacitor element and said extending portions of said first and second metal inserts being equal to the length of said glass envelope.

2. A capacitor in accordance with claim 1, wherein said layer of insulating material consists either of silicon dioxide or of silicon nitride.

3. A capacitor in accordance with claim 2, characterized in that the thickness of said first contact electrode is of the same order of magnitude as the thickness of said silicon disk.

4. A capacitor in accordance with claim 3, wherein said first contact electrode thickness is approximately 20 to 30% of the thickness of said silicon disk.

5. A capacitor in accordance with claim 1, characterized in that the thickness of said first contact electrode is of the same order of magnitude as the thickness of said silicon disk.

6. A capacitor in accordance with claim 5, wherein said first contact electrode thickness is approximately 20 to 30% of the thickness of said silicon disk.

7. A capacitor in accordance with claim 1, wherein said first contact electrode consists of a ductile metal.

8. A capacitor in accordance with claim 7, wherein said ductile metal is substantially silver.

9. A capacitor in accordance with claim 1, comprising a higher doped layer of the same conductivity type as that of said silicon disk arranged below said layer of insulating material.

10. A capacitor in accordance with claim 9, wherein said layer of insulating material consists either of silicon dioxide or of silicon nitride.

11. A capacitor in accordance with claim 10, characterized in that the thickness of said first contact electrode is of the same order of magnitude as the thickness of said silicon disk.

12. A capacitor in accordance with claim 11, wherein said first contact electrode thickness is approximately 20 to 30% of the thickness of said silicon disk.

13. A capacitor in accordance with claim 9, characterized in that the thickness of said first contact electrode is of the same order of magnitude as the thickness of said silicon disk.

14. A capacitor in accordance with claim 13, wherein said first contact electrode thickness is approximately 20 to 30% of the thickness of said silicon disk.

15. A capacitor in accordance with claim 9, wherein said first contact electrode consists of a ductile metal.

16. A capacitor in accordance with claim 15, wherein said ductile metal is substantially silver.

17. A process for manufacturing a capacitor in accordance with claim 9, including the following steps;
   producing in said silicon disk a layer which is doped higher than said silicon disk;
   producing said layer of insulating material on said first main surface;
   depositing a plastic film for serving as a masking layer, onto said layer of insulating material, and photolithographic structuring of the plastic film to provide an opening at the location of said first contact electrode;
   permitting the galvanic growth of said first contact electrode in said opening;
   removing said plastics film;
   depositing said second contact electrode on said second main surface;
   forming an assembly by inserting said capacitor element of said metal inserts into said glass envelope fusing said assembly.

18. A process in accordance with claim 17, wherein a plurality of said capacitor elements are simultaneously manufactured jointly in one silicon plate and where in said silicon plate is thereafter divided into a plurality of individual capacitor elements.

19. A process for manufacturing a capacitor in accordance with claim 1, including the following steps:
   producing said layer of insulating material on said first main surface;
   depositing a plastic film for serving as a masking layer, onto said layer of insulating material, and photolithographic structuring of the plastic film to provide an opening at the location of said first contact electrode;
   permitting the galvanic growth of said first contact electrode in said opening;
   removing said plastics film;
   depositing said second contact electrode on said second main surface;
   forming an assembly by inserting said capacitor element and said metal inserts into said glass envelope and fusing said assembly.

20. A process in accordance with claim 19, wherein a plurality of said capacitor elements are simultaneously manufactured jointly in one silicon plate and wherein said silicon plate is thereafter divided into a plurality of individual capacitor elements.

* * * * *